(12) United States Patent
Zheng et al.

(10) Patent No.: US 10,147,768 B2
(45) Date of Patent: Dec. 4, 2018

(54) ORGANIC SILICON ELECTROLUMINESCENT DISPLAY DEVICE

(71) Applicant: Shanghai Kerun Phosphor Technology Co., Ltd., Shanghai (CN)

(72) Inventors: Yan Zheng, Shanghai (CN); Suwen Guo, Shanghai (CN); Jingyu Bian, Shanghai (CN); Lei Chen, Shanghai (CN); Yun Jiang, Shanghai (CN); Ruijun Zhang, Shanghai (CN); Changbo Song, Shanghai (CN); Lihua Quan, Shanghai (CN); Lu Wang, Shanghai (CN); Hongmei Lu, Shanghai (CN)

(73) Assignee: Shanghai Kerun Phosphor Technology Co., Ltd., Shanghai (CN)

(*) Notice: Subject to any disclaimer, the term of this patent is extended or adjusted under 35 U.S.C. 154(b) by 0 days.

(21) Appl. No.: 15/695,020

(22) Filed: Sep. 5, 2017

(65) Prior Publication Data
US 2017/0365644 A1    Dec. 21, 2017

(30) Foreign Application Priority Data
May 27, 2017    (CN) .......................... 2017 1 0387606

(51) Int. Cl.
| H01J 1/62 | (2006.01) |
| H01L 27/32 | (2006.01) |
| H01L 51/52 | (2006.01) |
| H01L 51/50 | (2006.01) |

(52) U.S. Cl.
CPC .......... *H01L 27/32* (2013.01); *H01L 51/5012* (2013.01); *H01L 51/5253* (2013.01); *H01L 51/5262* (2013.01)

(58) Field of Classification Search
None
See application file for complete search history.

(56) References Cited

U.S. PATENT DOCUMENTS

| 6,887,591 | B2 * | 5/2005 | Nukada | ............... H01L 51/0035 313/504 |
| 7,274,413 | B1 * | 9/2007 | Sullivan | ............ G02F 1/133305 349/151 |
| 9,929,374 | B2 * | 3/2018 | Jin | ...................... H01L 51/5246 |

\* cited by examiner

*Primary Examiner* — Vip Patel

(57) ABSTRACT

An organic silicon electroluminescent display device includes a protective layer, a transparent conductive layer, an organic silicon electroluminescent layer and a basic conductive layer, which are combined to prepare a flat flaky or continuous wire or matrix point electroluminescent device. The basic conductive layer is made from a conductive material with good electroconductibility; the organic silicon electroluminescent layer is prepared through mixing an electroluminescent material with a resin or rubber material containing organic silicon; the transparent conductive layer is made from a conductive material with good electroconductibility; the organic silicon electroluminescent layer is located between the transparent conductive layer and the basic conductive layer; when an electric field is applied to both the transparent conductive layer and the basic conductive layer, the organic silicon electroluminescent layer with elasticity is bent, folded and pressed, and stretched to produce light with high brightness.

10 Claims, 2 Drawing Sheets

ORGANIC SILICON ELECTROLUMINESCENT DISPLAY DEVICE

CROSS REFERENCE OF RELATED APPLICATION

The present invention claims priority under 35 U.S.C. 119(a-d) to CN 201710387606.9, filed May 27, 2017.

BACKGROUND OF THE PRESENT INVENTION

Field of Invention

The present invention relates to an application technical field of electroluminescent devices.

Description of Related Arts

Electroluminescent devices have been widely used in fields of light emission, display and illumination. Existing electroluminescent devices are mainly plastic film devices, glass devices, linear devices and enamel devices, whose substrate is made of plastic, glass, enamel, metal and fabric, that is, the existing electroluminescent devices adopt epoxy resin, cyanoethyl sugar, inorganic enamel and plastic as basic substrate materials, so that while lighting, the existing electroluminescent devices do not have the small angle bending ability and the high voltage work ability. Simultaneously, some electroluminescent devices comprise the conductive adhesive layer, which complicates the structure of the electroluminescent devices, so that the EL (electroluminescent) intensity is lower, the drive voltage is higher, and the high-voltage working stability is poor, thus the practical application requirements are unable to be met. The above process and structure are described in detail in existing Chinese Patent No. ZL 2009101945318, No. ZL 01128299.1 and No. ZL 201210022011 and U.S. Pat. No. 7,737,633.

An organic silicon electroluminescent display device, provided by the present invention, comprises a protective layer, a transparent conductive layer, an organic silicon electroluminescent layer and a basic conductive layer, which are combined together to prepare a flat flaky or continuous wire or matrix point EL device, wherein: the basic conductive layer is made from a conductive material with good electroconductibility; the organic silicon electroluminescent layer is prepared through mixing an electroluminescent material with a resin or rubber material containing organic silicon; the transparent conductive layer is made from a conductive material with good electroconductibility; the organic silicon electroluminescent layer is located between the transparent conductive layer and the basic conductive layer; when an electric field is applied to both the transparent conductive layer and the basic conductive layer, the organic silicon electroluminescent layer with elasticity is bent, folded and pressed, and stretched to produce the light with high brightness.

The present invention is able to be prepared into EL sheets and EL lines, and widely used in the fields of light emission, display and illumination, such as clothing, toys, safety instructions, building decoration, photoelectric sensors, medical equipment, home appliances and electronic products, means of transportation and other traffic safety supplies. The present invention has advantages of high brightness, long life, high voltage resistance and low power consumption.

SUMMARY OF THE PRESENT INVENTION

An organic silicon electroluminescent display device comprises a protective layer, a transparent conductive layer, an organic silicon electroluminescent layer and a basic conductive layer, which are combined to prepare a flat flaky or continuous wire or matrix point EL (electroluminescent) device, wherein: the basic conductive layer is made from a conductive material with good electroconductibility; the organic silicon electroluminescent layer is prepared through mixing an electroluminescent material with a resin or rubber material containing organic silicon both of which have good tension; the transparent conductive layer is made from a conductive material with good electroconductibility; the organic silicon electroluminescent layer is located between the transparent conductive layer and the basic conductive layer; when an electric field is applied to both the transparent conductive layer and the basic conductive layer, light is produced; the organic silicon electroluminescent layer with elasticity is bent, folded and pressed, and stretched to produce the light with high brightness. The organic silicon electroluminescent display device, provided by the present invention, is adapted for flat matrix illumination display, point light source pixel display, EL fibers and clothing for EL display through weaving. The protective layer is made from an organic silicon material or elastic plastic. The organic silicon electroluminescent display device forms the elastic stretch luminescence.

In the present invention, the conductive material, made into the basic conductive layer, is one of a metal conductive material, a nano-conductive material, a polymer conductive material, an ion conductive material, an oxide conductive material and a carbon conductive material, which is formed by preliminarily preparing or spraying and printing in a late period. The basic conductive layer is prepared in a planar, dotted, linear form, such as a metal plane or a plane prepared through printing; is a regular matrix EL spot, a metal wire tube or a carbon fiber, or is formed through wrapping other nonconductive objects. The basic conductive layer is used to prepare electroluminescent sheets, electroluminescent lines, or electroluminescent matrix displays. When the basic conductive layer is made from a transparent or translucent conductive material such as a nano-conductive material, a double-sided or translucent EL device is obtained.

In the present invention, the conductive material, made into the transparent conductive layer, is one of a nano-conductive material, a polymer conductive material, an ion conductive material, an oxide conductive material and a carbon conductive material all of which are a transparent or translucent material with good electroconductibility. When the transparent conductive layer and the basic conductive layer are made from the transparent or translucent material, a double-sided or translucent EL device is obtained. The double-sided or translucent EL device is able to form the pattern stereo display. The transparent conductive layer, the organic silicon electroluminescent layer and the basic conductive layer are combined together through electrostatic adsorption. Changes in the thickness and the resistance affect the EL effect, EL intensity dynamic changes of touch luminescence, or pressure luminescence, or stretch luminescence, or temperature luminescence are formed through control.

In the present invention, the organic silicon electroluminescent layer is tightly sandwiched between the transparent conductive layer and the basic conductive layer, which are directly combined together through electrostatic adsorption. The transparent conductive layer and the basic conductive layer are respectively connected with power electrode leads which are regularly distributed at an interior, a surface or an edge of the EL sheet or EL wire. The power electrode leads are respectively connected with a DC (direct current) or an AC (alternating current) power supply, and are also able to be connected with a special driving device for control all kinds of flashing. The power electrode leads are made from a metallic or non-metallic material with good electroconductibility and are the sheets or wires. The protective layer completely or partially wraps the transparent conductive layer, the organic silicon electroluminescent layer, the basic conductive layer and the power electrode leads, such that the organic silicon electroluminescent display device stably works, wherein the partial wrapping aims at edges or electrodes, of course, the surface is able to be encapsulated through other transparent materials, so as to achieve other functions, such as touch lighting and pressure sensor. The protective layer is made from an organic silicon material or elastic plastic. The organic silicon electroluminescent display device forms the elastic stretch luminescence. The present invention also adopts other transparent protective layer materials to achieve better stable high-voltage EL effect. The present invention produces the light with high brightness without a conventional electroluminescent special driver.

In the present invention, the organic silicon electroluminescent layer is a thin film with a thickness of 0.03-3 mm prepared by mixing an inorganic electroluminescent material with an organic silicon material, wherein the organic silicon electroluminescent layer, with the thickness of 0.1 mm, better EL brightness and yield, and an even and smooth surface, is able to form a film through scraping, spin coating, calendering, squeezing, or spraying; and different processes are selected according to different shapes and different uses. An electroluminescent material, made into the organic silicon electroluminescent layer, adopts color electroluminescent powders to emit polychromatic lights. The existing inorganic electroluminescent material is mainly zinc sulfide doped with copper ions which is blue, green or blue-green; and zinc sulfide doped with copper and manganese ions which is orange, yellow, yellow-green and white. The organic silicon material is one of silicone rubber, fluorinated silicone rubber, silicone resin and silica gel, which is mixed with the electroluminescent material through a refine rubber or mechanical method. The organic silicon material is two-component solid or liquid which is evenly mixed with an inorganic sulfide electroluminescent material with a weight ratio of 1:(0.3-2), and preferably, the weight ratio of 1:1. In the present invention, the organic silicon electroluminescent layer is able to withstand ultra-high voltage luminescence and is stable without producing breakdown, wherein the organic silicon electroluminescent layer with the thickness of 1 mm is able to withstand more than 10,000 volts, the organic silicon electroluminescent layer with the thickness of 3 mm is able to independently light under 100,000 volts above. While being prepared, the organic silicon electroluminescent layer should be dense and is combined with the silicone rubber layer and fluorine-containing rubber layer to be applied to high-voltage cable luminescence. In the present invention, the electroluminescent layer of the electroluminescent device with elastic stretch produces continuous luminescence in the absence of electric field conditions by an external force. Of course, the electroluminescent powders are mixed with the rubber material to prepare particles, and then the electroluminescent layers with various forms are obtained through a film machine, a wire machine, an injection molding machine and an extruder. Under the action of external force or electric field, the electroluminescent layers with various forms produce the light with high brightness. It is important for the electroluminescent layers with various forms to have a tensile EL characteristic, the EL powders in the rubber is stretched to produce friction and charge accumulation to light under the external force, and especially, in the silicone rubber, the EL effect is obvious, a stretch degree thereof is 0.1 to 2 times the size of its own. While being stretched, the instantaneous brightness is able to reach more than 300 Cd, which is 50 times the current electroluminescent or long afterglow luminescent device. The organic silicon electroluminescent layer has lower power consumption, high dielectric constant and EL intensity after being prepared into the device, and adopts a smaller driver, which is unable to be achieved by epoxy resin materials. The organic silicon material is mixed with the polyurethane elastomer to obtain the polyurethane elastomer modified by the organic silicon material, which improves the elasticity and brightness. Of course, polyurethane materials are independently used, so that the electroluminescent voltage resistance is decreased.

In the present invention, an organic silicone dielectric layer or an elastic dielectric layer is located between the organic silicon electroluminescent layer and the basic conductive layer. The organic silicone dielectric layer is formed by combining an elastic silicone rubber layer and a fluorine-containing rubber layer, or is made from an organic silicone fluorine-containing rubber material and has a certain thickness; a thickness of the organic silicone dielectric layer is inversely proportional to an EL intensity, is proportional to a voltage, the luminescence is proportional to the voltage, the thickness of the organic silicone dielectric layer is in a range of 0.01-3 mm. When the plane matrix display is implemented, the power electrode leads are directly inserted into the organic silicone dielectric layer. FIG. 3 shows a lattice structure of the organic silicon electroluminescent device. Of course, the organic silicone dielectric layer is also able to be conventionally prepared by mixing elastic stretched rubber with a dielectric material, wherein the dielectric material is nano-barium titanate or nano-titanium dioxide. However, the organic silicone dielectric layer prepared by the above conventional material is unable to withstand high-pressure characteristics, so that it is unable to be used for light-emitting cable and for display. The elastic dielectric layer is a mixture of a dielectric material and a polyurethane elastomer.

In the present invention, one or multiple metal wires or sheets with good electroconductibility are added into the transparent conductive layer and the basic conductive layer, and especially, the metal wires or sheets have a stretch bounce shape after being bent. After combining the transparent conductive layer, the organic silicon electroluminescent layer and the basic conductive layer into a module, the module is sealed through colorless or color transparent plastic or rubber film for forming an electroluminescent film or electroluminescent linear device with elastic stretch; the transparent conductive layer and the basic conductive layer are processed into a multi-channel, multi-section and multi-point control through printing, or molding, or sputtering, so as to obtain a dynamic display EL effect.

In the present invention, the basic conductive layer is made of conductive metal lines with good electroconductibility, such as metal wires, metal pipelines or plastic pipelines with a metal layer on a surface thereof, which is processed to form the electroluminescent lines. FIG. 2 is a cross sectional view of the organic silicon electroluminescent device. A cross section of the conductive lines is round, square or flat strip with a continuous length. The metal lines are single or multiple, wherein multiple stranded wires are able to improve the tension and folding resistance. An insulation layer or no insulation layer is located on the metal lines. The insulation layer is able to achieve that the single metal line controls the partial luminescence. Every insulation line with the insulation layer on a surface thereof is spirally arranged or regularly woven to correspondingly connect with a multi-driver, so as to form flashing with all kinds of effects. Multiple metal lines with the insulation layer on the surface thereof are regularly combined to produce multi-channel control flashing. Multiple metal lines without the insulation layer on the surface thereof are regularly combined to improve the tensile strength and bending strength. In the present invention, the continuous length of the EL lines reaches 3000 m above.

In the present invention, the organic silicon electroluminescent lines are able to be combined with the wires and cables to form the EL wires for data transmission display of electronic products, such as EL headphone lines, EL mouse lines, mobile phone lines, computer wires and TV cables which are able to form flashing accompanied by music and current; and also for phone charging wires, such as the phone wires show the dynamic charging status. The EL wires are used as fire rescue life EL lines, such as single-handed roulette style EL line. The EL line is wound on a wheel shaft, both a battery and a control unit are located within a roulette axis, the EL line is combined with a steel wire, or a transparent bulletproof wire, or is woven with a floating rope, so as to form an EL rope which floats on the water surface. The EL wires are used as EL power wires, such as electric car charging wires, car power connection wires, outdoor temporary power wires, power socket wires and electrical wires for household appliances such as vacuum cleaners and washing machines. The EL wires are used as EL communication wires, such as telephone wires, fiber optic cables and communication switch wires. The EL wires are used as safety signs EL wires to mark the safety instructions in the channel corridors, stairs, subways and shopping malls. FIG. 4 is a structurally schematic view of the organic silicon electroluminescent device, wherein the power data cables, the shielding layer and multiple organic silicon electroluminescent wires are combined together and are enwrapped by the transparent plastic; multiple organic silicon electroluminescent wires are regularly arranged and controlled by a corresponding chip control driving device to produce spiral luminescence, so as to form the regularly directional flaring. The organic silicon electroluminescent wire, provided by the present invention, has a diameter of 0.1-10 mm, and is flexible and pushed or pulled through a roulette; a smaller driver is able to be located within the roulette; so it is easy to be carried to be used for fire rescue lighting. The present invention is also able to be used in combination with other ropes to prepare the EL ropes which floats on the water surface.

In the present invention, both the transparent conductive layer and the basic conductive layer are made from metal oxide ITO film with good electroconductibility, wherein the ITO film is formed through vacuum sputtering or spraying ITO nano-materials and prepared on a PET substrate film with large area, of course, or prepared on other materials. The method provided by the present invention is adapted for preparing the flaky electroluminescent device with a voltage of 70-380 V and a frequency of 50 Hz to produce the light with stable, safe and long life.

In the present invention, the organic silicon electroluminescent layer is prepared by mixing the electroluminescent material with the resin or rubber material containing the organic silicon. Under the action of external force, the independently formed organic silicon electroluminescent layer produces the electret effect luminescence, and is stretched, squeezed, torn, heated and rubbed to produce flashing and luminescence. The organic silicon electroluminescent layer, which is independently used, is able to detect the tension and pressure to form the sensor.

These and other objectives, features, and advantages of the present invention will become apparent from the following detailed description, the accompanying drawings, and the appended claims.

Figure 1:
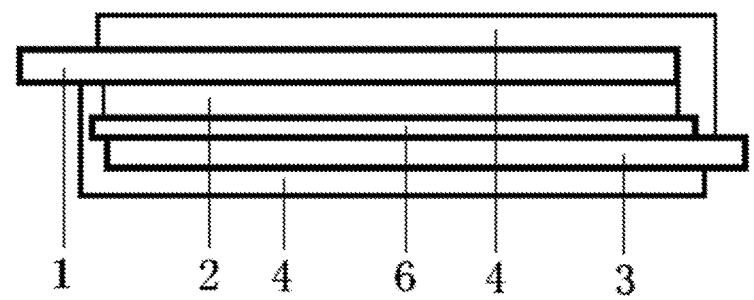
FIG. 1 is a first structural diagram of an organic silicon electroluminescent device provided by the present invention.
Figure 2:
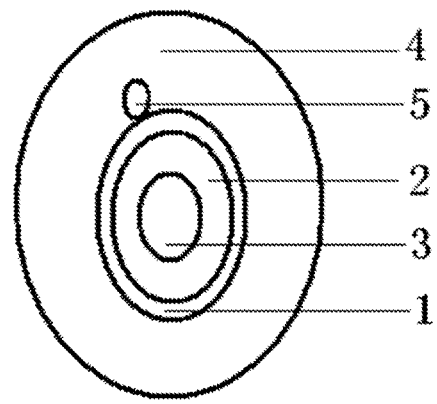
FIG. 2 is a second structural diagram of the organic silicon electroluminescent device provided by the present invention.
Figure 3:
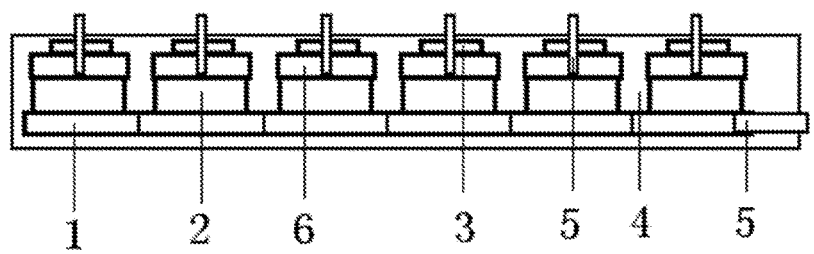
FIG. 3 is a third structural diagram of the organic silicon electroluminescent device provided by the present invention.
Figure 4:
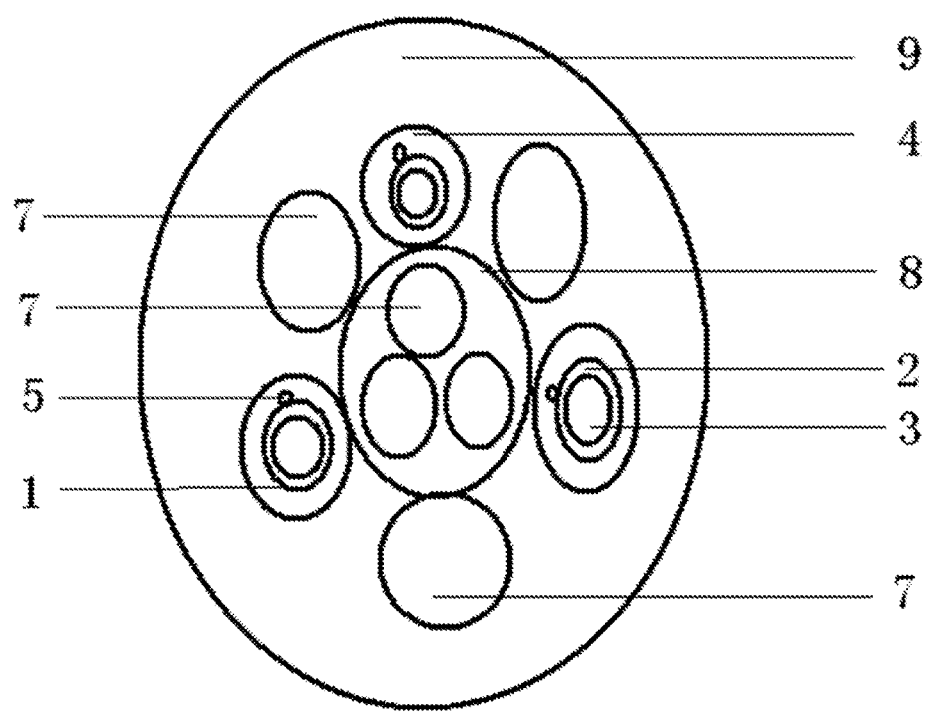
FIG. 4 is a fourth structural diagram of the organic silicon electroluminescent device provided by the present invention.

In the drawings, 1: transparent conductive layer; 2: organic silicon electroluminescent layer; 3: basic conductive layer; 4: protective layer; 5: power electrode lead; 6: organic silicone dielectric layer; 7: power data cable; 8: shielding layer; 9: transparent plastic.

DETAILED DESCRIPTION OF THE PREFERRED EMBODIMENT

An organic silicon electroluminescent display device comprises a protective layer 4, a transparent conductive layer 1, an organic silicon electroluminescent layer 2 and a basic conductive layer 3, which are combined to prepare an EL (electroluminescent) film, a matrix EL display, an EL point light source and an EL line with continuous length, wherein: the basic conductive layer 3 is made from a conductive material with good electroconductibility, the organic silicon electroluminescent layer 2 is made from an electroluminescent material mixed with a resin or rubber material containing organic silicon, the transparent conductive layer 1 is made from a conductive material with good electroconductibility, the organic silicon electroluminescent layer 2 is located between the transparent conductive layer 1 and the basic conductive layer 3; when an electric field is applied to both the transparent conductive layer 1 and the basic conductive layer 3, light is produced, the organic silicon electroluminescent layer 2 is bent, folded and pressed, and stretched to produce the light with high brightness. FIG. 1 is a planar structural diagram of the organic silicon electroluminescent display device.

In the present invention, the conductive material, made into the basic conductive layer 3, is a metal conductive material, such as gold, silver, copper and aluminum; a nano-conductive material, such as nano gold and nano silver; a polymer conductive material or a conductive material containing lithium-ion; an oxide conductive material such as indium oxide and zinc oxide; or a carbon conductive material such as carbon fiber, carbon powder and grapheme, which is preliminarily prepared into metal wires, metal sheets, etc., or is sprayed and printed in late period to form a conductive film. The basic conductive layer 3 is prepared in a planar, dotted, linear form, such as a metal plane, a filament, a lattice, or printed as a flat surface; is also a regular matrix EL spot, a metal wire tube or a carbon fiber wire tube, and even a three-dimensional object. A plane thickness of the basic conductive layer 3 is 0.01-1 mm, and a diameter thereof is 0.1-10 mm when the basic conductive layer 3 is used to prepare the EL line, which mainly lies in the basic conductive layer 3 with good electroconductibility. The basic conductive layer 3 is also able to be formed by wrapping other non-conductive objects, for example, a surface of a plastic comprising PVC, PP, PET and PU is coated with a layer of conductive aluminum, or is printed with silver paste, so as to form the electroluminescent sheet, the electroluminescent line, or the electroluminescent matrix display. The basic conductive layer 3, made from a transparent or translucent conductive material such as a nano-conductive material, a polymer conductive material, and a lithium-ion conductive material, is used to prepare a double-sided EL device.

In the present invention, the conductive material, made into the transparent conductive layer 1, is a nano-conductive material such as nano silver; a polymer conductive material or a conductive material containing lithium-ion such as a conjugated polymer material; an oxide conductive material such as indium oxide and zinc oxide; or a carbon conductive material such as grapheme, which is a transparent or translucent material at the same time with good electroconductibility. The transparent conductive layer 1 and the basic conductive layer 3, made from a transparent or translucent conductive material, are used to prepare a double-sided or translucent EL device, which displays pattern and lights to obtain a special effect. A thickness of the transparent conductive layer 1 is in a range of 10-300 nm and mainly prepared in accordance with conductive and transparent features.

In the present invention, the organic silicon electroluminescent layer 2 is tightly sandwiched between the transparent conductive layer 1 and the basic conductive layer 3, all of which are directly adsorbed through static electricity or be attached through own viscosity while being prepared. The transparent conductive layer 1 and the basic conductive layer 3 are respectively connected with power electrode leads 5 such as metal thin wires, carbon fiber, silver paste and aluminum foils. The power electrode leads 5 are regularly distributed at an interior, a surface and an edge of the EL film or line. The power electrode leads 5 are connected with a DC (direct current) or an AC (alternating current) power supply, and are also able to be connected with a special driving device for control all kinds of flashing. The power electrode leads 5 are made from a metallic or nonmetallic material with good electroconductibility and able to be sheets or wires. The protective layer 4 completely or partially wraps the transparent conductive layer 1, the organic silicon electroluminescent layer 2, the basic conductive layer 3 and the power electrode leads 5, such that the organic silicon electroluminescent display device stably works, wherein the partial wrapping is able to aim at the edge or electrode, of course, the surface is able to be encapsulated through other transparent materials, to achieve other functions, such as touch lighting and pressure sensor.

In the present invention, the organic silicon electroluminescent layer 2 is a thin film with a thickness of 0.03-3 mm prepared by mixing an inorganic electroluminescent material with an organic silicon material, and then evenly stirring through a refine rubber machine or a mixer, wherein the organic silicon electroluminescent layer 2 with the thickness of 0.1 mm has better EL brightness and yield and even and smooth surface, is able to form a film through scraping, spin coating, calendering, squeezing, or spraying, that is, according to different shapes and different uses, different processes are selected. A particle size of the electroluminescent material is 7 μm or 30 μm, such as D502S, D512B, D582 and D611 electroluminescent materials of KPT phosphor com. The organic silicon material is one of silicone rubber, fluorinated silicone rubber, silicone resin and silica gel, which is mixed with the electroluminescent material through a refine rubber or mechanical method. The organic silicon material is two-component solid, also able to liquid, and evenly mixed with an inorganic sulfide with a weight ratio of 1:(0.3-2), and preferably, the weight ratio of 1:1. When the electroluminescent material is too much, the elasticity is not good. In the present invention, the organic silicon electroluminescent layer 2 is able to withstand ultra-high voltage to light, and is stable without producing breakdown; the thickness of the organic silicon electroluminescent layer 2 is proportional to a withstand voltage, the organic silicone electroluminescent layer with the thickness of 1-2 mm is able to withstand more than 10,000 volts, the organic silicon electroluminescent layer 2 with the thickness of 3-5 mm is able to independently light under 100,000 volts above. While being prepared, the organic silicon electroluminescent layer 2 should be dense, and is combined with the silicone rubber and the fluorine-containing rubber layer together within the organic silicon electroluminescent layer 2 to be applied to high-voltage cables for lighting. A basic conductive metal wire is firstly prepared, and then wrapped with the organic silicon electroluminescent layer 2 through an extruder; also, an organic silicon electroluminescent tube is firstly prepared and then the basic conductive metal wire is inserted thereinto. Color light or white light is also able to be achieved by fluorescent pigments or dyes, such as azo type and rhodamine B; the organic fluorescent pigment is added to change a color and improve 30% of light intensity; a weight ratio of the organic fluorescent pigment and rubber is in a range of (0.001-0.03):1, so as to obtain a better effect, and especially electroluminescent materials using blue, such as D447B and D502B, have better effect. A combination of the organic electroluminescent material and the organic silicon material is able to produce organic electroluminescence, which gives out light at the DC voltage or AC voltage, but has low anti-voltage degree and not good stability under high voltage. The organic silicon material is mixed with polyurethane elastomer to improve the elasticity and brightness. Of course, the less the organic silicon material, the polyurethane material is independently used, so that the electroluminescent voltage resistance is decreased.

In the present invention, an organic silicone dielectric layer is located between the organic silicon electroluminescent layer 2 and the basic conductive layer 3. The organic silicone dielectric layer is formed by combining an elastic silicone rubber layer and a fluorine-containing rubber layer, or is made from an organic silicone fluorine-containing rubber material and has a certain thickness; a thickness of the fluorinated silicone rubber is inversely proportional to the EL intensity, is proportional to the voltage, the luminescence is proportional to the voltage, and the thickness of the organic silicone dielectric layer is in a range of 0.01-3 mm. When the plane matrix display is implemented, the power electrode leads are directly inserted into the organic silicone dielectric layer. Of course, the organic silicone dielectric layer is also able to be conventionally prepared by mixing the elastic stretched rubber with the dielectric material, wherein the dielectric material is nano-barium titanate or nano-titanium dioxide, but the organic silicone dielectric layer prepared by the traditional material is unable to withstand high-voltage characteristics, so that it is unable to be adapted for the EL cable and for display. The elastic dielectric layer is a mixture of a dielectric material and a polyurethane elastomer, wherein the dielectric material is nano-titanium dioxide, barium titanate, etc.

In the present invention, one or multiple metal wires or sheets with good electroconductibility are added into the transparent conductive layer 1 and the basic conductive layer 3, and especially, the basic conductive layer 3 has an elastic stretch function, the metal wires or sheets thereof have a stretch bounce shape after being bent. After combining the transparent conductive layer 1, the organic silicon electroluminescent layer 2 and the basic conductive layer 3 into a module, the module is sealed through colorless or color transparent plastic or rubber film for forming an electroluminescent film or electroluminescent linear device with elastic stretch; the transparent conductive layer 1 and the basic conductive layer 3 are prepared into a multi-channel, multi-section and multi-point control through printing, or molding, or sputtering, so as to obtain a dynamic display EL effect.

In the present invention, the basic conductive layer 3 is made of conductive metal lines with good electroconductibility, such as metal wires, metal pipelines or plastic pipelines with a metal layer on a surface thereof, which is processed to form the electroluminescent tubes. A cross section of the conductive lines is round, square or flat strip with a continuous length. The metal lines are single or multiple, wherein multiple stranded wires are able to improve the tension and folding resistance, such as multiple copper wires with a diameter of 0.1 mm. An insulation layer or no insulation layer is located on the metal lines. The insulation layer is able to achieve that the single metal line controls the partial luminescence. Every insulation line with the insulation layer on a surface thereof is spirally arranged or regularly woven to correspondingly connect with a multi-driver, so as to form flashing with all kinds of effects. Multiple metal lines with the insulation layer on the surface thereof are regularly combined to produce multi-channel control flashing. Multiple metal lines without the insulation layer on the surface thereof are regularly combined to improve the tensile strength and bending strength. In the present invention, the organic silicon electroluminescent lines are able to be combined with the wires and cables to form the EL wires for data transmission display of electronic products, mobile phone USB charging cables, fire rescue life lines, light communication lines, light headphone cables, security signs EL lines. The multiple organic silicon electroluminescent lines are combined with the wires, wherein multiple power data cables 7 with different functions, the shielding layer 8 containing aluminum foil, and the multiple organic silicon electroluminescent lines are combined to be enwrapped by transparent plastic 9 or color transparent plastic. The multiple organic silicon electroluminescent lines are regularly arranged and control the corresponding chip control driving device to produce spiral luminescence, so as to form regularly directional flashing.

In the present invention, both the transparent conductive layer 1 and the basic conductive layer 3 are made from metal oxide ITO film with good electroconductibility, wherein the ITO is formed through vacuum sputtering or spraying ITO nano-materials and prepared on a PET substrate film with large area; of course, or prepared on other materials. The method provided by the present invention is adapted for preparing the flaky electroluminescent device with a voltage of 70-380 V and a frequency of 50 Hz to produce the light with stable, safe and long life. Other ATO or ZnO conductive nano-materials are also able to achieve the above functions. It may also be graphene or nonwoven fabric made from grapheme. The method provided by the present invention is able to produce double-sided luminescence. If the basic conductive layer 3 is an opaque metal conductive layer through printing or spraying method, the single-sided luminescence is produced, such as silver paste, copper paste, carbon paste, and aluminum foil.

In the present invention, the organic silicon electroluminescent layer 2 is prepared by mixing the electroluminescent material with the resin or rubber material containing the organic silicon. Under the action of external force, the independently formed organic silicon electroluminescent layer produces the electret effect luminescence, and is stretched, squeezed, torn, heated and rubbed to produce flashing and luminescence. The organic silicon electroluminescent layer, which is independently used, is able to detect the tension and pressure to form the sensor. In the present invention, the metal conductive lines or sheets, such as spirally spring-shaped conductive copper wires and wavy sheets, are able to be added into the transparent conductive layer 1 and the basic conductive layer 3 to improve the electroconductibility; once the metal conductive lines or sheets are embedded into the resin rubber, the conductive efficiency is improved, and simultaneously, the stretch and rebound are not affected, and the ultimate tensile strength is increased.

Advantages of the present invention are as follows.

(1) While being used, the luminescent device has good anti-million-volt high voltage characteristic, which is able to be directly adapted for commercial power indications, and is also adapted for high voltage wires and cables or transformer. The present invention is resiliently stretched and is also able to simultaneously reduce the use voltage and improve the EL intensity. According to the change of the resistance, the present invention is equipped with a photometer, a CCD imaging, fiber, etc. to control the formation of touch luminescence, or pressure luminescence, or tensile luminescence, or temperature variable luminescence, or a photoelectric sensor which is voltage-regulated and dynamically changed in the EL intensity, such as a pressure EL sensor used to measure the weight, wind speed, water flow, tension and so on, wherein the pressure is large, the EL intensity is strong. Other sensors are able to be used for ultra-high voltage measurement, temperature change measurement and tension change measurement.

(2) The present invention is able to be widely used in the field of light emission, display and illumination, and in particular, manufacturing EL wires for safe night instructions. It is also able to be used for clothing, toys, safe instructions, architectural decoration, photoelectric sensors, medical equipment, home appliances and electronic products, travel, aircraft and other vehicle safety supplies. The present invention is also able to be used for mobile phones, computers, earphones, electric wires, refrigerators, washing machines, automobiles, sports equipment, shoes and hats, clothing, doors and windows, elevators, motorcycles, bicycles, ground channel safety instructions, tensile ropes, subways, lamps, power switches, massage equipment, machine arms, safety warning display and so on. The present invention is particularly applicable to dark night lighting. The silicon EL layer used in the present invention has good isolation of water molecules, and its service life is able to be increased to 50,000 hours or more, and no special packaging is needed. The EL layer of the present invention does not break due to fatigue bending, resulting in a short circuit, and is particularly suitable for movement and supporting the use of electronic equipment.

(3) The present invention is a surface light source or a line light source which is able to be combined into a dynamic intelligent EL display by electronic chip control, such as using voice control, light control, or connection with an automatic machine, and is able to display patterns, characters and the like. For flexible display, voltage display, dynamic neon, 3D electroluminescent devices, three-dimensional display of objects and flexible EL keyboard. The electroluminescent layer is also able to directly used to light without electric field, so as to observe building cracks, plant growth, sports training; and is adapted for the EL sensor based on high-speed moving object resistance design and measurement.

After the preferred embodiments of the present invention have been exemplified, it will be apparent to those skilled in the art that various changes and modifications to the present invention will be made without departing from the spirit and scope of the present invention are within the protective scope of the present invention.

What is claimed is:

1. An organic silicon electroluminescent display device, comprising a protective layer, a transparent conductive layer, an organic silicon electroluminescent layer and a basic conductive layer, wherein: the organic silicon electroluminescent display device is a flaky, linear or matrix point EL (electroluminescent) device; the basic conductive layer is made from a conductive material; the organic silicon electroluminescent layer is made from a mixing material of an electroluminescent material with a resin or rubber material containing organic silicon; the transparent conductive layer is made from a conductive material; the organic silicon electroluminescent layer is located between the transparent conductive layer and the basic conductive layer; so that when an electric field is applied to both the transparent conductive layer and the basic conductive layer, the organic silicon electroluminescent layer with elasticity is bent, folded and pressed, and stretched to produce light with high brightness.

2. The organic silicon electroluminescent display device, as recited in claim 1, wherein: the conductive material, made into the basic conductive layer, is one of a metal conductive material, a nano-conductive material, a polymer conductive material, an ion conductive material, an oxide conductive material and a carbon conductive material; the basic conductive layer is prepared in a planar, dotted or linear form to form an electroluminescent sheet, an electroluminescent line, or an electroluminescent matrix displays; the basic conductive layer is made from a transparent or translucent conductive material to obtain a double-sided or translucent EL device.

3. The organic silicon electroluminescent display device, as recited in claim 1, wherein: the conductive material, made into the transparent conductive layer, is one of a nano-conductive material, a polymer conductive material, an ion conductive material, an oxide conductive material and a carbon conductive material; when the transparent conductive layer and the basic conductive layer are made from a transparent or translucent material, a double-sided or translucent EL device is obtained; the transparent conductive layer, the organic silicon electroluminescent layer and the basic conductive layer are combined together through electrostatic adsorption; a thickness of the transparent conductive layer, the organic silicon electroluminescent layer and the basic conductive layer varies with a resistance thereof to form an EL intensity dynamic change of touch luminescence, or pressure luminescence, or stretch luminescence, or temperature luminescence through control.

4. The organic silicon electroluminescent display device, as recited in claim 1, wherein: the organic silicon electroluminescent layer is tightly sandwiched between the transparent conductive layer and the basic conductive layer; the transparent conductive layer and the basic conductive layer are respectively connected with power electrode leads; the power electrode leads are respectively connected with a DC (direct current) or an AC (alternating current) power supply, and made from a metallic or non-metallic material; the protective layer completely or partially wraps the transparent conductive layer, the organic silicon electroluminescent layer, the basic conductive layer and the power electrode leads, such that the organic silicon electroluminescent display device stably works.

5. The organic silicon electroluminescent display device, as recited in claim 1, wherein: the organic silicon electroluminescent layer is a thin film with a thickness of 0.03-3 mm prepared by mixing an inorganic electroluminescent material with an organic silicon material, the thin film is formed through scraping, spin coating, calendering, squeezing, or spraying; the inorganic electroluminescent material adopts color electroluminescent powders to emit polychromatic lights; the organic silicon material is one of silicone rubber, fluorinated silicone rubber, silicone resin and silica gel; the organic silicon material is two-component solid or liquid; a weight ratio of the organic silicon material to the inorganic electroluminescent material in the organic silicon electroluminescent layer is 1:(0.3-2); the organic silicon material is mixed with a polyurethane elastomer to improve an elasticity.

6. The organic silicon electroluminescent display device, as recited in claim 1, wherein: an organic silicone dielectric layer or an elastic dielectric layer is located between the organic silicon electroluminescent layer and the basic conductive layer; the organic silicone dielectric layer is formed by combining an elastic silicone rubber layer and a fluorine-containing rubber layer, or is made from an organic silicone fluorine-containing rubber material and has a certain thickness to withstand ultra-high voltage insulation; a transparent and translucent organic silicone dielectric layer forms a double-sided electroluminescent device; the elastic dielectric layer is a mixture of an elastic dielectric material and a polyurethane elastomer.

7. The organic silicon electroluminescent display device, as recited in claim 1, wherein: one or multiple metal wires or sheets are added into the transparent conductive layer and the basic conductive layer; the metal wires or sheets have a stretch bounce shape after being bent; after combining the transparent conductive layer, the organic silicon electroluminescent layer and the basic conductive layer into a module, the module is sealed through colorless or color transparent plastic or rubber film for forming an electroluminescent film or electroluminescent linear device with elastic stretch; the transparent conductive layer and the basic conductive layer are processed into a multi-channel, multi-section and multi-point control through printing, or molding, or sputtering, so as to obtain a dynamic display EL effect.

8. The organic silicon electroluminescent display device, as recited in claim 1, wherein: the basic conductive layer is made of conductive metal lines; a cross section of the conductive lines is round, or flat strip with a continuous length; the metal lines are single or multiple; an insulation layer or no insulation layer is located on the metal lines;

multiple metal lines with the insulation layer on a surface thereof are regularly combined to produce multi-channel control flashing; multiple metal lines without the insulation layer on a surface thereof are regularly combined to improve tensile strength and bending strength; multiple organic silicon electroluminescent lines are regularly combined with multiple wires to form flow EL data cables.

9. The organic silicon electroluminescent display device, as recited in claim 1, wherein: both the transparent conductive layer and the basic conductive layer are made from metal oxide ITO film, the ITO film is prepared on a PET substrate film with large area to form a flaky electroluminescent device with a voltage of 70-380 V and a frequency of 50 Hz to produce light with stable, safe and long life.

10. The organic silicon electroluminescent display device, as recited in claim 1, wherein: the organic silicon electroluminescent layer is prepared by mixing an electroluminescent material with a resin or rubber material containing an organic silicon; under an action of external force, the independently formed organic silicon electroluminescent layer produces electret effect luminescence, and is stretched, squeezed, torn, heated and rubbed to produce luminescence; the protective layer is made from an organic silicon material or an elastic material; the organic silicon electroluminescent display device produces elastic stretch luminescence.

\* \* \* \* \*